United States Patent
Hackl et al.

(10) Patent No.: US 9,157,944 B2
(45) Date of Patent: Oct. 13, 2015

(54) METHOD AND A DEVICE FOR IMPRESSING A MEASURING-SIGNAL VOLTAGE ON A POWER SUPPLY NETWORK

(75) Inventors: Dieter Hackl, Fernwald (DE); Burkhard Macht, Hungen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 729 days.

(21) Appl. No.: 13/552,371

(22) Filed: Jul. 18, 2012

(65) Prior Publication Data
US 2013/0020861 A1    Jan. 24, 2013

(30) Foreign Application Priority Data
Jul. 20, 2011    (DE) .......................... 10 2011 079 455

(51) Int. Cl.
| G01R 31/00 | (2006.01) |
| G01R 27/18 | (2006.01) |
| G01R 31/02 | (2006.01) |
| G01R 31/14 | (2006.01) |
| H04B 3/56  | (2006.01) |

(52) U.S. Cl.
CPC ............... *G01R 27/18* (2013.01); *G01R 31/02* (2013.01); *G01R 31/14* (2013.01); *H04B 3/56* (2013.01); *H04B 2203/5466* (2013.01); *H04B 2203/5483* (2013.01); *H04B 2203/5491* (2013.01)

(58) Field of Classification Search
CPC ................ G01R 31/02; G01R 31/14
USPC ......................................... 307/3, 4
See application file for complete search history.

(56) References Cited

U.S. PATENT DOCUMENTS

| 4,896,115 A | 1/1990 | LeMaitre et al. |
| 2007/0273391 A1* | 11/2007 | Corry ............................ 324/649 |
| 2009/0322358 A1* | 12/2009 | Imaizumi ........................ 324/713 |
| 2011/0184680 A1* | 7/2011 | Imaizumi et al. ............... 702/65 |

FOREIGN PATENT DOCUMENTS

| CN | 1267401 A | 9/2000 |
| CN | 201364367 Y | 12/2009 |
| DE | 3422252 A1 | 12/1985 |
| DE | 3882833 T2 | 2/1994 |
| DE | 19513441 A1 | 10/1996 |
| DE | 10355086 A1 | 6/2005 |
| EP | 0297933 A1 | 1/1989 |
| EP | 1267467 A2 | 12/2002 |

(Continued)

OTHER PUBLICATIONS

European Patent Office, Search Report, Application No. 12174624, Nov. 27, 2012.

(Continued)

*Primary Examiner* — Adi Amrany
(74) *Attorney, Agent, or Firm* — Quarles & Brady LLP

(57) ABSTRACT

A method and device for impressing a measuring-signal voltage (U) on a power supply network in which a generator signal ($U_{sig}$) is alternately sampled by two sample-and-hold elements (20, S1, S3), the sampled values are alternately allocated to a first pulse sequence (P1) and a second pulse sequence (P2), the pulse sequences (P1, P2) are separately inductively transmitted and the secondary-side measuring-signal voltage (U) is formed by adding the induced partial voltages (U1, U2) together.

10 Claims, 3 Drawing Sheets

(56) References Cited

FOREIGN PATENT DOCUMENTS

| | | |
|---|---|---|
| EP | 2256506 A1 | 12/2010 |
| JP | 2009058428 A * | 3/2009 |
| WO | 2005050229 A1 | 6/2005 |

OTHER PUBLICATIONS

State Intellectual Property Office of People's Republic of China, First Office Action and Search Report, Application No. 201210251646.8, Jul. 3, 2014, 7 pages [English Language Translation Only].

* cited by examiner

METHOD AND A DEVICE FOR IMPRESSING A MEASURING-SIGNAL VOLTAGE ON A POWER SUPPLY NETWORK

CROSS REFERENCE TO RELATED APPLICATION

The present application claims the benefit of German Patent Application No. 10 2011 079 455.7 filed Jul. 20, 2011, which is fully incorporated herein by reference.

STATEMENT REGARDING FEDERALLY SPONSORED RESEARCH OR DEVELOPMENT

Not applicable.

FIELD OF THE INVENTION

The invention relates to a method for impressing a measuring-signal voltage on a power supply network comprising the steps of providing a generator signal and inductively transmitting the generator signal into the power supply network.

Furthermore the invention relates to a device for impressing a measuring-signal voltage on a power supply network comprising a signal generator for providing a generator signal and a transmitting unit for inductively transmitting the generator signal into the power supply network.

BACKGROUND OF THE INVENTION

When it comes to ensuring sufficient personal and plant protection during the operation of electrical power grid systems the insulation resistance is of special importance. If the insulation resistance drops below a predefined value protection against direct or indirect contact with the electrical plant is diminished; in addition leakage currents may occur leading to malfunctioning of electrical devices or to a costly interruption in the operation. Protection against fire is another reason why plant operators and the insurance industry have an interest in maintaining the plant in perfect technical condition as regards its insulation resistance.

It is therefore necessary to constantly monitor the insulation resistance in electrical plants. One active measuring process for measuring the insulation resistance has proven to be that of introducing an AC voltage as a measuring signal because it is easy to couple to the supply network via a transformer, provided the power supply network is grounded.

However, with processes based on AC voltage measurements, it has to be borne in mind that apart from the insulation resistance which is regarded as a purely ohmic resistance component, the capacitive component of the complex-valued network leakage impedance is another important factor. In particular in spatially expanded networks the network leakage capacity may increase to such an extent that determination of the insulation resistance would be distorted by capacitive leakage currents. For a predefined measuring (AC-) voltage these capacitive leakage currents are dependent upon the capacitive conductance which again increases as the frequency increases. It is therefore desirable, on the one hand, to keep the measuring frequency as low as possible in order to counter the high network leakage capacity for expanded line assemblies, and on the other, minimising the capacitive conductance which increases proportionally with the frequency.

Furthermore, a low measuring frequency leads to a lower current load on the protective conductor if network leakage capacities are large. This, in turn, means a reduced load on the protective conductor from functional requirements thereby substantially precluding endangering the protective concept of a "protective conductor". This as well promotes acceptance of a new device technology.

Selecting a suitable, i.e. a minimum measuring frequency, is therefore of special importance. A low measuring frequency of the impressing measuring signal permits monitoring of major grounded power supply networks, and any high-frequency interferences which may occur, for example from frequency converters, can be filtered out due to the greater frequency gap using less expensive filter circuits.

For example it is known from the applicant's published patent application DE 103 55 086 A1 to determine the insulation resistance by introducing a rectangular-shaped common mode voltage signal against ground, wherein feeding-in of the generator signal is preferably effected via a transformer. The measuring frequency results from the base frequency contained in the rectangular oscillation over time and is separated by means of filtering from the other higher-frequency signal components present in the line network. For a network frequency of 50 Hz it is proposed to use a measuring frequency of 175 Hz for the generator signal to be fed.

With this method which proposes supplying the generator signal by means of a transformer it has proved to be disadvantageous that there are limits as to how far the measuring frequency range can be extended towards the low frequencies by using a transformer. Since the induced voltage on the secondary side is proportional to the temporal change in magnetic induction the induced voltage also drops for a decreasing base frequency of the fed-in signal. In order to compensate for this decrease in voltage the number of windings and/or the core cross-section of the transformer could be increased by the same amount. This, however, would mean the use of disproportionately more expensive and larger transformers which in addition would be uneconomical with regard to power requirements. In order to achieve a voltage amplitude on the secondary side for measuring-signal frequencies, which lie distinctly below 100 Hz and that is sufficiently large for ensuring a reliable use of the process, the transformers required would be so expensive that corresponding terminal prices for products in line with the market would not be realistic in the intended user environment. According to the state of the art and based on economic considerations the measuring frequency is limited to values above approximately 100 Hz when using transformers for the signal supply. In conclusion it can therefore be said that the problem lies not in generating a low-frequency generator signal on the primary side, but in inductively transmitting or coupling it in a product-specific manner to the current supply network.

SUMMARY OF THE INVENTION

The present invention is therefore based on the requirement to further develop a method and a device for impressing measuring-signal voltages on a current supply network such that a cost-effective impressing of low-frequency measuring signals is realisable.

This requirement based on a method described herein, is met in that the generator signal is sampled alternately by two sampled-and-hold elements, the sampled values are allocated alternately to a first pulse sequence and a second pulse sequence, the pulse sequences are separately inductively transmitted, the secondary-side measuring-signal voltage is formed by adding the induced partial voltages together.

The principal idea of the present invention is based advantageously on the use of two transformers of a lesser size instead of only one substantially more expensive and larger transformer. The two transformers are operated at a much higher frequency, preferably in the range from 100 Hz upwards and into the MHz range and therefore can, according to the findings based on the induction law, have a reduced core section, i.e. reduced dimensions for a constant induced voltage—which is in keeping with the intended cost reduction. In order to achieve the desired low-frequency measuring-signal voltage on the secondary side, a low-frequency generator signal is initially sampled alternately by two sample-and-hold elements, wherein the sampling rate lies many times above the base frequency of the generator signal. To this end the respectively current voltage values of the generator signal are tapped alternately by two sample-and-hold elements at equidistant time intervals and alternately allocated to a first pulse sequence and a second pulse sequence. Due to allocating them alternately two pulse sequences are created which are time-shifted against each other by the duration of the hold time, wherein alternately one pulse sequence assumes a value of zero, whilst the respectively other pulse sequence supplies a sampled value.

Due to the sample-and-hold circuit, the pulse sequences consist of rectangular pulses the height of which corresponds to the respective value of the sampled generator signal. The pulse sequences are separately inductively transmitted via two different transformers. Since sampling is effected at a sampling rate substantially above the base frequency of the generator signal and the pulse sequences generated from the sampled values are therefore subject to a much higher rate of change than the continuous-time generator signal, the transformers are operated at a much higher frequency. This has the effect, according to the invention, of achieving a higher induced voltage compared to using the continuous-time generator signal for driving the transformers directly.

On the secondary side, the measuring-signal voltage is formed by adding the time-shifted induced (partial) voltages pulses together in order to be able to use the induced voltage components of both transmission paths across the entire time progression. Advantageously a low-frequency generator signal is thus transmitted by sampling to the secondary side and it is available there, as required, as a low-frequency measuring signal.

In a further advantageous development, sampling is performed by the sample-and-hold elements at a pulse frequency of $f_{pulse}=1/t_{pulse}$, respectively, wherein the hold time $t_{hold}$ respectively corresponds to half a pulse duration. Selecting these sampling parameters results in the sampled values of one pulse sequence having a value of zero, whilst the sampled values of the respectively other pulse sequence assume the sampled value of the generator signal. The summed two signal components according to the invention then supply a voltage progression over time which approximates the low-frequency signal voltage step by step and following corresponding low-pass filtering, generates the desired low-frequency measuring voltage on the secondary side.

Advantageously the separate inductive transmission of the pulse sequences periodically continues over two time periods, wherein in a first time period coinciding with the hold time of the first sample-and-hold element the magnetic core of a first transformer is modulated by a rectangular pulse of the first pulse sequence present on the primary side, a second transformer, corresponding to the time-shifted second pulse sequence does not receive a generator signal and is held at 0V on the primary and the secondary side during degradation of the stored energy, wherein as a result of the modulation on the primary side a first partial voltage is formed on the secondary side of the first transformer. In the second time period immediately following the first time period and coinciding with the hold time of the second scan-hold element, the magnetic core of a second transformer is modulated by a rectangular pulse of the second pulse sequence present on the primary side, the first transformer, corresponding to the time-shifted first pulse sequence, does not receive a generator signal and is held at 0V during degradation of the stored energy on both the primary and the secondary side, wherein as a result of the modulation on the primary side a second partial voltage is formed on the secondary side of the second transformer.

In the first period of time, the first transformer is operated by a rectangular pulse whilst the second transformer is advantageously disconnected by suitable circuitry from the generator, and where due to short-circuiting on the primary and secondary side a degradation of the stored energy is made possible. The measuring voltage generated in the power supply network is formed in this first period of time by the voltage induced in the secondary winding of the first transformer. In the second period of time immediately following the first period of time the second transformer is operated by a rectangular pulse, whilst in the first transformer a degradation of energy takes place during short-circuiting of the windings. In this second period of time the generated measuring voltage is formed by the voltage of the second transformer induced in the secondary winding. This second period of time is immediately followed by further periodically continuing cycles consisting of first and second time periods.

The generator signal may assume any given signal over time including a DC-voltage and is, in particular, be a rectangular-shaped signal voltage. A rectangular-shaped voltage over time is easily generated and reflects the signal frequency of a sinusoidal signal in its base frequency. Filtering circuits may be used to separate and evaluate this base frequency.

With respect to a device, the requirement is met in that the transmitting unit for the inductive transmission of the generator signal for inductively transmitting the generator signal into the power supply network comprises a primary-side switching unit for sampling the generator signal and for dividing the sampled values into two pulse sequences time-shifted against each other, two series-connected transformers on the output side for the separate inductive transmission of the pulse sequences and a secondary-side switching unit for adding the time-shifted induced pulse sequences together.

The primary-side switching unit is used, on the one hand, as a sampling unit for the generator signal, and on the other, to divide the sampled values into two pulse sequences that are time-shifted against each other. The two pulse sequences then advantageously supply two separate transformers.

In order to fulfil the tasks of time discretisation and pulse sequence generation as well as of degradation of the stored energy in the magnetic core of the respective transformer, the primary-side switching unit consists of two switching elements which connect the primary winding of the respective transformer alternately with the signal generator and of two further switching elements which alternately short-circuit the respective primary winding. Using this circuitry on the primary side, in the time periods in which one of the two transformers is connected with the generator signal the respectively other transformer is short-circuited and its stored energy is degraded.

The secondary-side switching unit advantageously consists of a first switching group which connects the induced voltages of the first transformer to the power supply network or short-circuits its secondary windings, and a series-connected second switching group which alternately thereto connects the induced voltages of the second transformer to the power supply network or short-circuits its secondary windings.

This implementation of the secondary-side switching unit causes, when the first switching group is opened, the voltage of the first transformer induced on the secondary side to be connected into the grid system, wherein a switching element is provided for each conductor in the first and second switching group and, at the same time, when the second switching group is closed, allows the energy in the second transformer to be degraded. Thereupon the first switching group is closed and the second switching group is opened causing energy degradation in the first transformer and transmission of the induced voltage in the second transformer into the grid system.

In a preferred implementation, the switching elements of the switching units are implemented as (power) semi-conductor switching elements. The semi-conductor elements may be diodes, transistors or thyristors; these are not subject to wear and are able to process high switching frequencies.

Furthermore, the device comprises a control circuit for the time control of the primary and secondary switching units. The control circuit is used to determine the opening and closing times of the primary-side and secondary-side switching units thereby allowing sampling, energy degradation and connection to the grid system to be performed synchronously for both transmission paths.

In an advantageous design each of the two transformers has a smaller core cross-section than a single transformer generating the same secondary voltage for a conventional low-frequency transmission using transformers. Using this design the device according to the invention allows smaller size transformers to be used which reduce the cost component of the transformers and result in market-specific products.

Further advantageous design features result from the description hereunder and the drawings explaining a preferred embodiment of the invention by way of examples.

DETAILED DESCRIPTION OF THE EXAMPLE EMBODIMENTS

Figure 1:
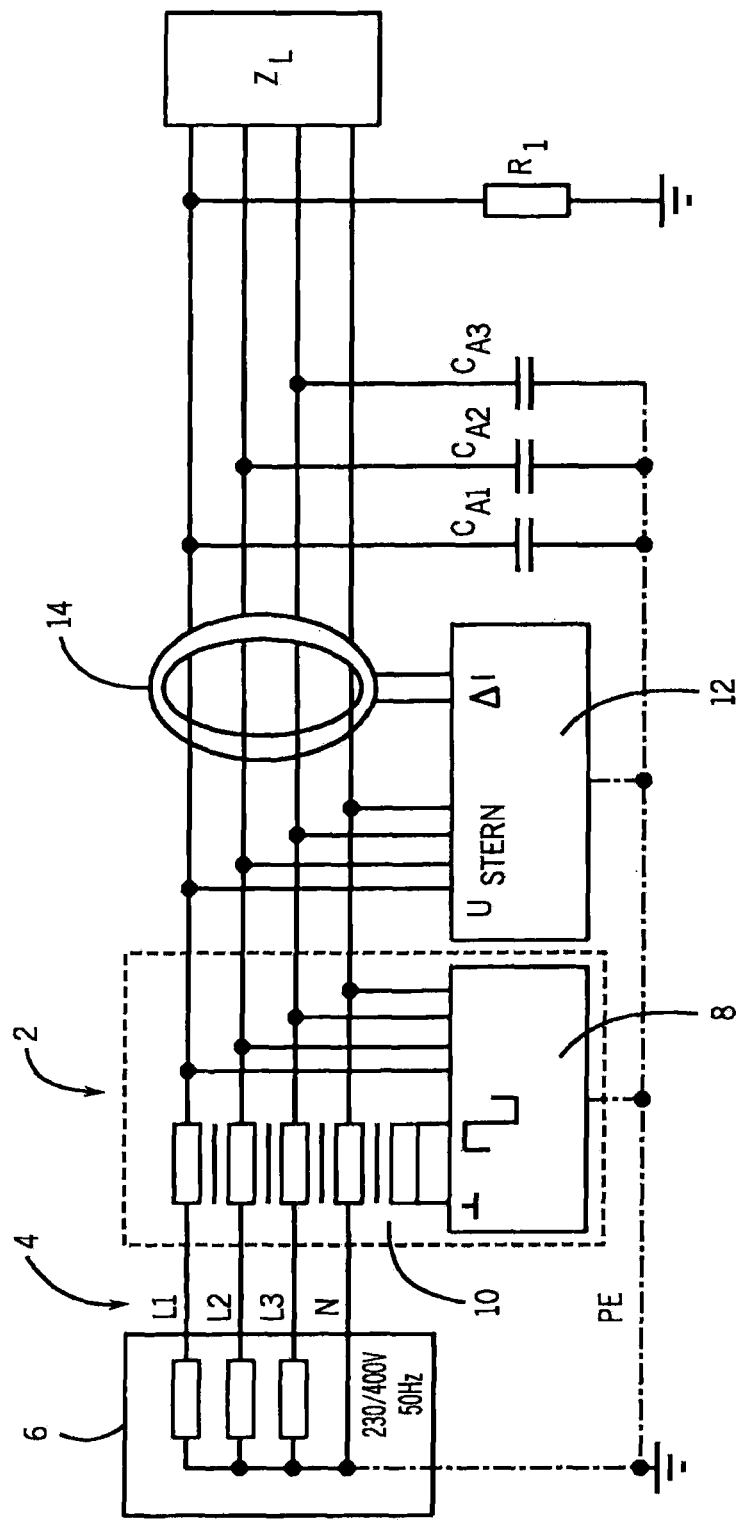
FIG. 1 shows one application of the present invention.

FIG. 1 shows a typical application of the method according to the invention as well as of the device 2 according to the invention for impressing a measuring-signal voltage U on a power supply network 4. The power supply network 4 is implemented as a grounded network 4 with three active conductors L1, L2, L3 and a neutral conductor N. Impressing a measuring signal takes place between the network supply 6 and the consumer $Z_L$ shown as a load resistance by means of the device 2 according to the invention schematically illustrated by a signal generator 8 and a common mode transformer 10. Filtering and evaluation of the measuring signal for determining an (ohmic) insulation resistance $R_F$ is accomplished over by an evaluation unit 12 to which a measuring-current transformer 14 is connected which captures a residual current $\Delta I$ occurring in conductors L1, L2, L3 and N. A capacitive component of the complex-valued network leakage impedance is shown simplified for each active conductor by the respective capacity $C_{A1}$, $C_{A2}$ and $C_{A3}$.

Figure 2:
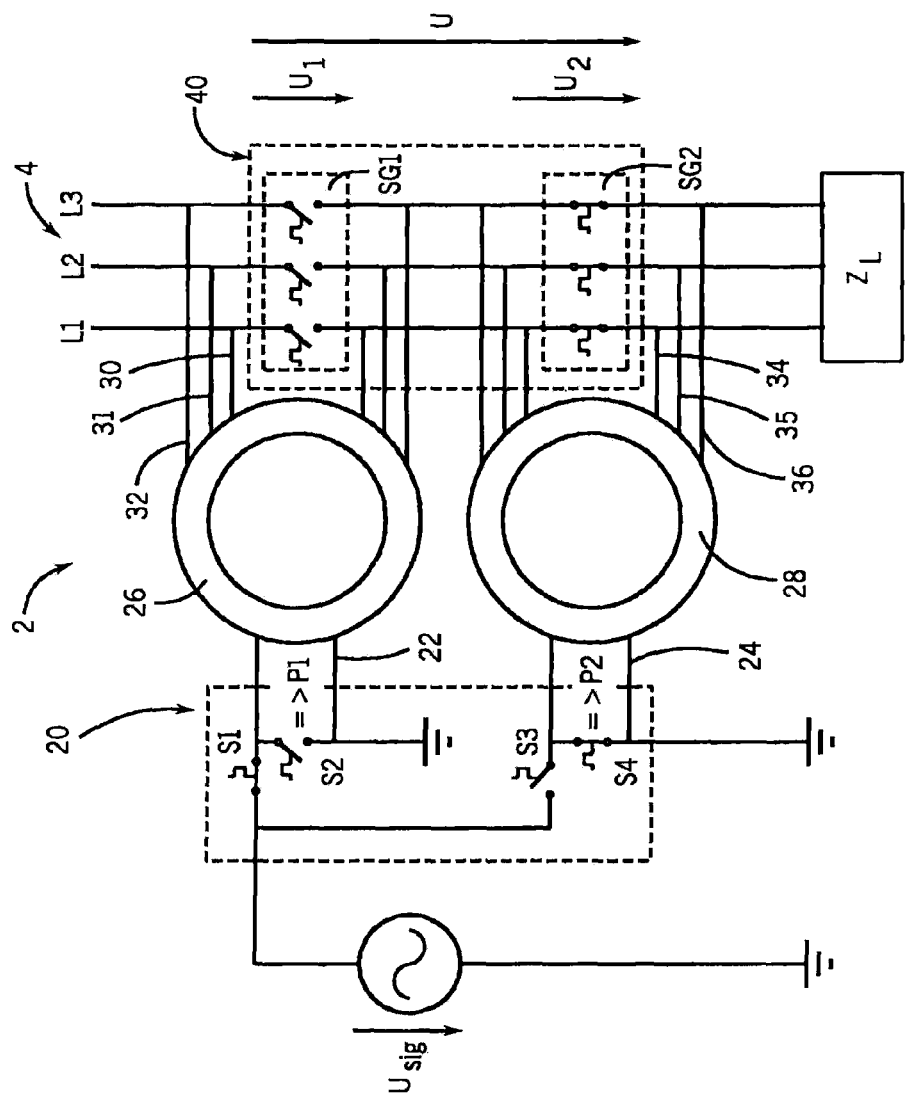
FIG. 2 shows a principal construction of the device according to the invention.

FIG. 2 shows the principal construction of device 2 according to the invention which is also used to explain how the method according to the invention is executed. In the schematic drawing a low-frequency generator signal voltage $U_{sig}$ is connected via a primary-side switching unit 20 with primary windings 22, 24 of two transformers 26, 28. On the secondary side the two transformers 26, 28 each comprise three windings 30, 31, 32 and 34, 35, 36 connected, respectively, to conductors L1, L2 and L3, wherein a secondary-side switching unit 40 performs the connection of a first and a second induced partial voltage $U_1$, $U_2$. Impressing of the measuring-signal voltage U composed of induced partial voltages $U_1$, $U_2$ is executed for all active conductors L1, L2, L3 and neutral conductor N in the same way; in the interest of simplifying the drawing neutral conductor N is not shown in FIG. 2.

In detail, the primary-side switching unit 20 consists of four switching elements S1, S2, S3 and S4, wherein the switching elements S1 and S3 alternately establish or cancel the connection between the generator signal $U_{sig}$ and the primary windings 22, 24 of the respective transformer 26, 28 and the switching elements S2 and S4 alternately short-circuit the respective primary windings 22, 24. The switching elements S1 and S3 may be understood as realisations of the sample element of a sampling circuit. At the point in time shown in FIG. 2 within a time period T1 the switching element S1 is closed, whilst the switching elements S2 and S3 are opened. The generator signal voltage $U_{sig}$ is present at the primary winding 22 of the first transformer 26, whilst the connection of primary winding 24 of the second transformer 28 to the generator signal $U_{sig}$ is interrupted. At the same time switching element S4 is closed, causing the primary winding 24 of the second transformer 28 to be short-circuited and allowing the energy stored in the previous scanning cycle to be degraded. In a time period T2 immediately following the time period T1 switching elements S1, S2 change their respective state, so that the primary winding 24 of the second transformer 28 is now connected with the generator signal voltage $U_{sig}$ via the now closed switching element S3 and the opened switching element S4, and energy degradation in the first transformer 26 can take place via the closed switching element S2 and with switching element S1 open.

The secondary-side switching unit 40 comprises a first switching group SG1 and a second switching group SG2, wherein the switching elements of the first switching group SG1 are found on the conductor sections of conductors L1, L2 and L3 between the connecting points of secondary windings 30, 31, 32 of the first transformer 26, and the switching elements of the second switching group SG2 are found between the connecting points of secondary windings 34, 35, 36 of the second transformer 28. The switching groups SG1 and SG2 are controlled synchronously with the switching elements S1 to S4 such that in the first time period T1, in which the generator signal voltage $U_{sig}$ is connected to the first transformer 26, a first partial voltage $U_1$ induced in the first transformer 26 is also transmitted via the opened switching elements of the first switching group SG1 to the conductors L1, L2 and L3. At the same time the switching elements of the second switching group SG2 are closed thereby permitting energy degradation on the secondary side in the second transformer 28 via its short-circuited windings 34, 35, 36. Correspondingly the opened switching elements of switching group SG2 permit transmission of the second partial voltage $U_2$ induced in the second transformer 28 in time period $T_2$ into grid system 4, whilst in windings 30, 31, 32 of first transformer 26 a compensating current for energy degradation can flow via the closed switching elements of the first switching group SG1.

Figure 4:
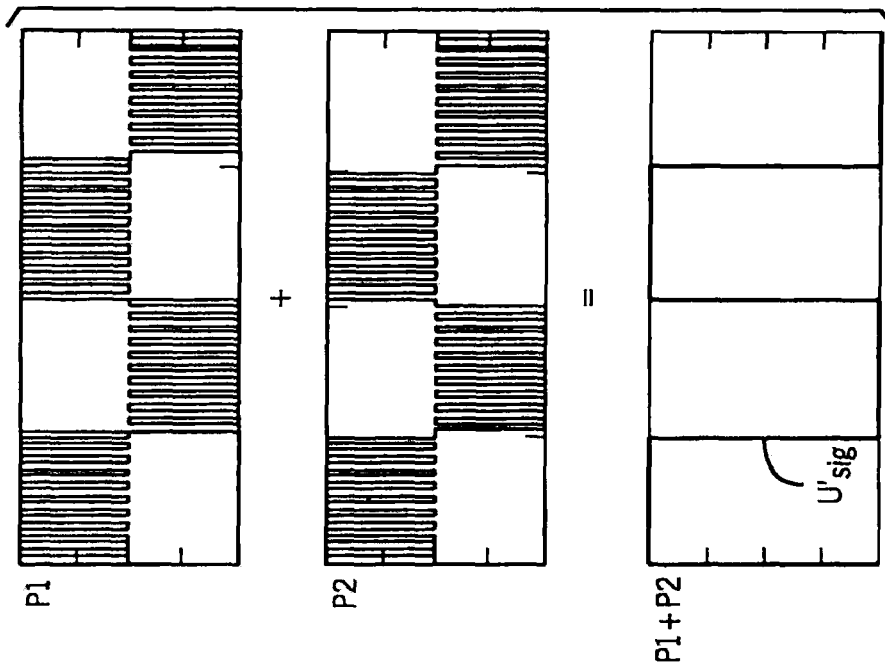
FIG. 4 shows voltages over time of a sampled rectangular-shaped generator signal.
Figure 3:
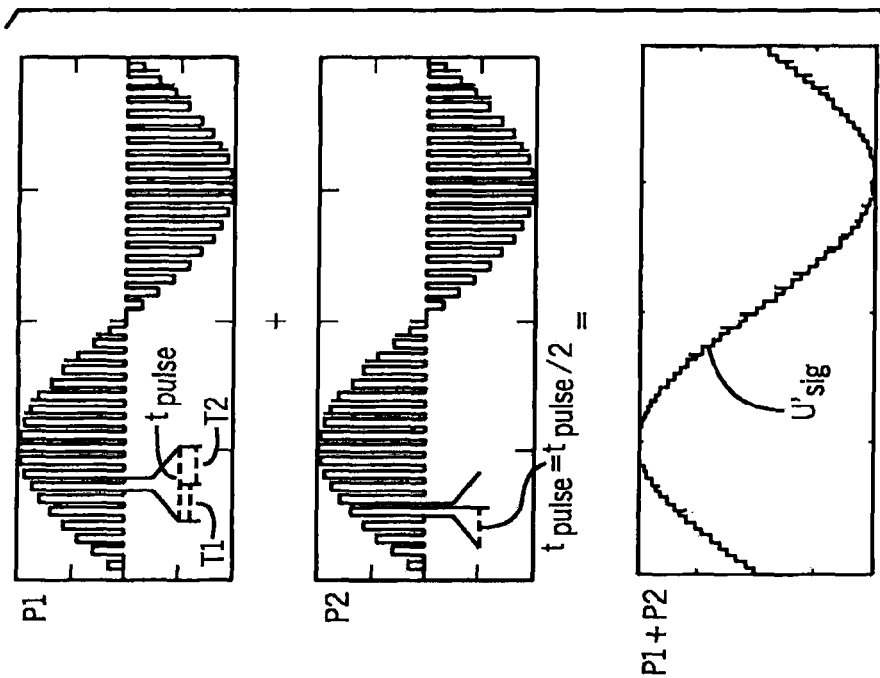
FIG. 3 shows voltages over time of a sampled sine-shaped generator signal.

Due to the alternating sampling which takes place on the primary side by means of the primary-side switching unit 20 in conjunction with the secondary-side switching unit 40 controlled synchronously thereto, two pulse sequences P1 and P2, time-shifted against each other by a hold time $t_{hold}$ are formed (see FIGS. 3 and 4). These pulse sequences P1 and P2 are then transmitted separately via the first and second transformers 26, 28. Thus the low-frequency primary-side generator signal voltage $U_{sig}$ is mapped time-discretely on the secondary side and may be reconstructed without errors by means of suitable low-pass filtering taking the sampling theorem into account. The desired low-frequency measuring-signal voltage U is then available in power supply network 4.

FIGS. 3 4 show the voltages over time of a sampled generator signal $U'_{sig}$ and illustrate its primary-side composition from the summation of the two time-shifted pulse sequences P1 and P2. Sampling of each pulse sequence is effected at pulse frequency $f_{pulse}$ and hold time $t_{hold}$ corresponds to half the pulse duration $t_{pulse}=1/2f_{pulse}$. Due to the time-shift by hold time $t_{hold}$ the pulse sequences P1, P2 alternately fill the sampling gaps and ad up to give a sampled generator signal $U'_{sig}$ which is a step-like approximation of sine-shaped (FIG. 3) generator signal voltage $U_{sig}$. In the case of a rectangular-shaped (FIG. 4) generator signal voltage $U_{sig}$ the superposition of pulse sequences P1, P2 leads to an almost exact replication of generator signal voltage $U_{sig}$.

The invention claim is:

1. A method for impressing a measuring-signal voltage on a power supply network comprising the steps of:
    providing a generator signal;
    generating sampled values by alternately sampling the generator signal by two sample-and-hold elements to alternately produce a first pulse sequence and a second pulse sequence; and
    inductively transmitting the first and second pulse sequences separately into the power supply network to induce partial voltages, wherein a secondary-side measuring-signal voltage is formed in the power supply network by adding the induced partial voltages.

2. The method according to claim 1, in which sampling by the sample-and-hold elements is performed using a pulse frequency and in that the hold time corresponds to half a pulse duration, respectively.

3. The method according to claim 1, in which the separate inductive transmission of the first and second pulse sequences continues periodically over two time periods, wherein in a first time period coinciding with the hold time of the first sample-and-hold elements,
    a primary winding of a first transformer is modulated by a rectangular pulse of the first pulse sequence thereby inducing a first partial voltage across a secondary winding of the first transformer,
    zero volts is applied to a primary winding and a secondary winding of a second transformer, wherein the secondary winding is connected to the power supply network, and wherein any energy stored in the primary and secondary windings of the second transformer decays;
and in that in the second time period coinciding with the hold time of the second sample-and-hold element and immediately following the first time period,
    a primary winding of the second transformer is modulated by a rectangular pulse of the second pulse sequence, thereby inducing a second partial voltage across the secondary winding of the second transformer,
    zero volts is applied to the primary winding and the secondary winding of the first transformer, wherein any energy stored in the primary and secondary windings of the first transformer decays.

4. The method according to claim 1, in which the generator signal assumes any given signal over time including a DC-voltage.

5. A device for impressing a measuring-signal voltage on a power supply network comprising:
    a signal generator for providing a generator signal;
    a transmitting unit for inductively transmitting the generator signal into the power supply network, the transmitting unit including a primary-side switching unit for sampling the generator signal and for dividing the samples into two pulse sequences time-shifted with respect to each other, two series-connected transformers for inductively transmitting the pulse sequences into the power supply network, and a secondary-side switching unit for adding the time-shifted, induced pulse sequences together.

6. The device according to claim 5, in which the primary side switching unit comprises two switching elements which alternately connect the primary windings of the first and second transformers to the signal generator and two further switching elements which alternately short-circuit the respective windings.

7. The device according to claim 6, which the switching elements of the switching units are implemented as semiconductor switching elements.

8. The device according to claim 5, in which the secondary side switching unit comprises a first switching group, which alternately connects the induced pulse sequences from one of the transformers to the power supply network and short-circuits secondary windings of the one transformer; and a series-connected second switching group, which alternately connects the induced pulse sequences of the other one of the transformers to the power supply network and short-circuits secondary windings of the other transformer.

9. The device according to claims 5, including a control circuit for time control of the primary and secondary switching units.

10. The device according to claims 5, in which each of the two transformers has a smaller core cross-section than a single transformer generating the same secondary voltage for a conventional low-frequency transmission with the aid of transformers.

* * * * *

UNITED STATES PATENT AND TRADEMARK OFFICE
CERTIFICATE OF CORRECTION

PATENT NO.         : 9,157,944 B2
APPLICATION NO.    : 13/552371
DATED              : October 13, 2015
INVENTOR(S)        : Dieter Hackl et al.

It is certified that error appears in the above-identified patent and that said Letters Patent is hereby corrected as shown below:

Claims

Column 8, line 36, Claim 6
"tive windings." should be --tive primary windings.--

Column 8, line 49, Claim 9
"claims" should be --claim--

Column 8, line 52, Claim 10
"claims" should be --claim--

Signed and Sealed this
Twenty-second Day of March, 2016

Michelle K. Lee
*Director of the United States Patent and Trademark Office*